United States Patent [19]

Hamburgen

[11] Patent Number: 4,839,774
[45] Date of Patent: Jun. 13, 1989

[54] APPARATUS AND METHOD FOR COOLING ELECTRONIC COMPONENT PACKAGES USING AN ARRAY OF DIRECTED NOZZLES FABRICATED IN THE CIRCUIT BOARD

[75] Inventor: William R. Hamburgen, Menlo Park, Calif.

[73] Assignee: Digital Equipment Corporation, Maynard, Mass.

[21] Appl. No.: 147,755

[22] Filed: Jan. 25, 1988

[51] Int. Cl.$^4$ ............................ H02B 1/00; H05K 7/20
[52] U.S. Cl. ............................................. 361/383
[58] Field of Search ......................... 361/382, 383, 384

[56] References Cited

U.S. PATENT DOCUMENTS 4,399,484  8/1983  Mayer .................................. 361/383
4,498,118  2/1985  Bell ...................................... 361/384

Primary Examiner—Roy N. Envall, Jr.
Attorney, Agent, or Firm—William W. Holloway; David G. Pursel

[57] ABSTRACT

In a data processing system, the packages containing the electronic components are cooled by directing the cooling material through an array of nozzles toward the packages and components. The nozzles are fabricated in the circuit board, the flow of the coolant being the result of a difference in pressure of the coolant between the two sides of the circuit board. In the preferred embodiment, the nozzles are positioned directly below the component package. The component packages are removed from the surface of the circuit board, to which the component package is attached, to permit relatively uninhibited flow by the coolant past the component package. The nozzle arrays can be implemented to compensate for a non-uniform distribution of heat sources within a component package to provide a generally uniform temperature for the package or component. When the heat dissipation from a component package is non-uniform, a specific nozzle array configuration can be used to provide a generally uniform temperature distribution for the component package.

15 Claims, 2 Drawing Sheets

APPARATUS AND METHOD FOR COOLING ELECTRONIC COMPONENT PACKAGES USING AN ARRAY OF DIRECTED NOZZLES FABRICATED IN THE CIRCUIT BOARD

BACKGROUND OF THE INVENTION

1. Field of the Invention

This invention relates generally to the packaging of electronic components in a data processing or a similar system and, more particularly, to the cooling of the electronic components.

2. Description of the Related Art

As the density of electronic elements in the component packages used in data processing and other electronic systems has increased, the removal of heat generated in the packages has provided an increasingly severe problem. The simplest technique for cooling the component packages has been the immersion of the circuit board with coupled active components in cooling liquid, gas or mixture thereof. While this technique provides adequate thermal control of active circuit components in many applications, because heat transfer is a function of the difference in temperature between the two regions, as the cooling medium in the vicinity of the component package increases in temperature, the cooling becomes less efficient. In extreme examples, this phenomenon can result in failure of the components because of severely reduced heat transfer to the cooling medium.

To improve the cooling efficiency when using a cooling fluid, apparatus for causing circulation of the cooling medium can be provided. To the extent that the circulation prevents the cooling medium from remaining in the proximity of hot regions and removes the heat transferred to the (now warmed) cooling medium to a different location, this technique greatly improves the cooling efficiency. However, general circulation of the cooling medium may not provide circulation in the specific areas requiring cooling and, more specifically, the hottest portion of component package can be the bottom of the package, a region where a general circulation can be ineffective.

Other techniques that have been used in an attempt to provide cooling for the component packages involve the use of solid cooling materials that conduct heat from the package to a heat sink or provide a large area for the conduction of heat to the surrounding cooling medium. While these techniques have been widely implemented, these techniques typically require manual installation of the conducting path and or heat sink, a process that can be expensive and can result in a bulky and heavy package. This technique can also be relatively inefficient in removing heat from the component package.

A need has therefore existed for a technique that permits the removal of heat from component packages coupled to a circuit board that is more effective then the methods of the related art.

FEATURES OF THE INVENTION

It is an object of the present invention to provide an improved electronic system using high element density component packages.

It is a feature of the present invention to provide improved cooling for component packages in electronic systems.

It is another feature of the present invention to provide nozzles directing a cooling medium on an electronic component or component package.

It is a more particular feature of the present invention to provide a differential pressure of a fluid cooling medium between the two sides of a circuit board, locate apertures in the circuit board in the vicinity of an electronic component or component package and, by means of the apertures and difference in pressure, direct the cooling medium on the component package.

SUMMARY OF THE INVENTION

The aforementioned and other features are accomplished, according to the present invention, by providing differential pressure between the two sides of a circuit board to which electronic components and/or component packages are attached, the low pressure side of the circuit board being the side to which the component packages are attached. The component packages to be cooled are positioned away from the circuit board. Apertures are formed in the circuit board in the vicinity i.e., typically beneath, of the component package. The difference in the pressure of the cooling medium causes the cooling medium to move through the apertures, impinge on the component package and flow past the component package. The impingement and flow of the cooling medium results in efficient cooling of the component package and, particularly, the base of the component package which, because of the position of the active components, is frequently the hottest portion of the package.

These and other features of the present invention will be understood upon reading of the following description along with the drawings.

BRIEF DESCRIPTION OF THE DRAWINGS

FIG. 4A illustrates a technique for cooling localized components according to the present invention, while

DESCRIPTION OF THE PREFERRED EMBODIMENT

1. Detailed Description of the Figures

Figure 1:
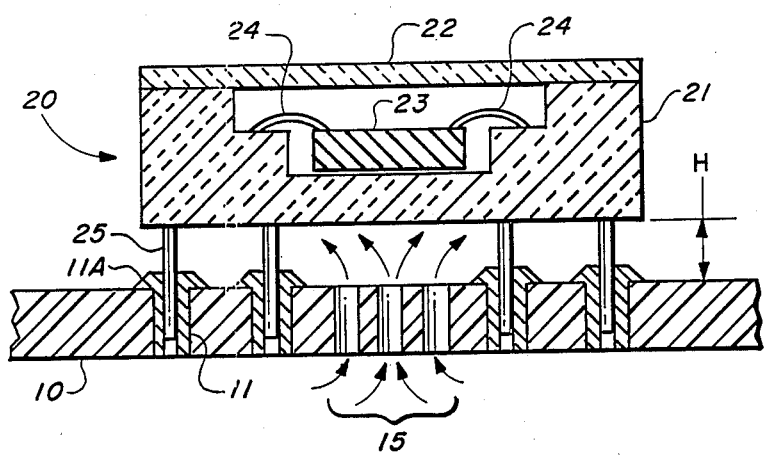
FIG. 1 is a cross section view of a thru-hole component package coupled to a circuit board indicating the general position of the nozzles through which the cooling medium is directed toward the component package.

Referring now to FIG. 1, a cross-section diagram shows the relationship of a thru-hole component package 20 and a circuit board 10 having an aperture (nozzle) array associated therewith. The die 23 includes the electrical and electronic components incorporated in the component package, the electronic components of the die 23 generally being the heat producing elements. The die 23 is coupled to the component package body 21 and is enclosed in the package by component package lid 22. The die 23 has conducting leads 24 coupled thereto, the conducting leads being the means by which electrical signals are exchanged with the elements of the die and by which electrical energy is applied thereto.

The conducting leads 24 of the die 23 are, in turn, coupled to the pins 25 of the component package. The component package pins 25 provide the mechanism for exchange of signals and energy between the conducting leads 24 and the circuits external to the component package 20. In the thru-hole component package, 20 the pins are inserted and soldered in thru-holes or vias 11 (i.e. apertures in the circuit board) to couple the component package 20 to the circuit board 10. (The thru-holes 11 are in turn coupled to conducting traces (paths) on or in the circuit board 10. The thru-holes 11 can have sockets 11A associated therewith to facilitate insertion of the component package leads in the thru-holes.) The nozzle or aperture array 15 is positioned relative to the thru-holes 11 or sockets 11A (and consequently the component package 20) to be proximate to the die 23 of the component package 20.

Figure 2:
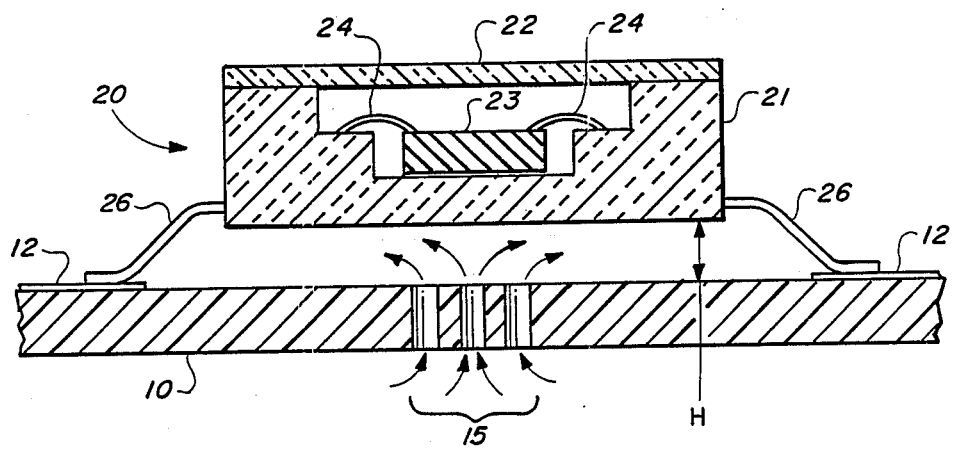
FIG. 2 is a cross section view of a surface-mount component package coupled to a circuit board indicating the general position of the nozzles directing the cooling medium toward the component package.

Referring next to FIG. 2, the cross sectional view of a component package 20 and a circuit board 10 having an aperture (or nozzle) array 15 is shown for a surface mount component package. The circuit mount component package configuration differs from FIG. 1 in that the pins 25 of component package 20 are replaced by conducting leads 26, the conducting leads 26 being the functional equivalent of the pin 25 of FIG. 2. The conducting leads 26 are electrically coupled to conducting pads and conducting traces 12 located on or in the circuit board. The circuit board 10 has an array of apertures nozzles) positioned directly below the die 23 of component package 20.

Figure 3:
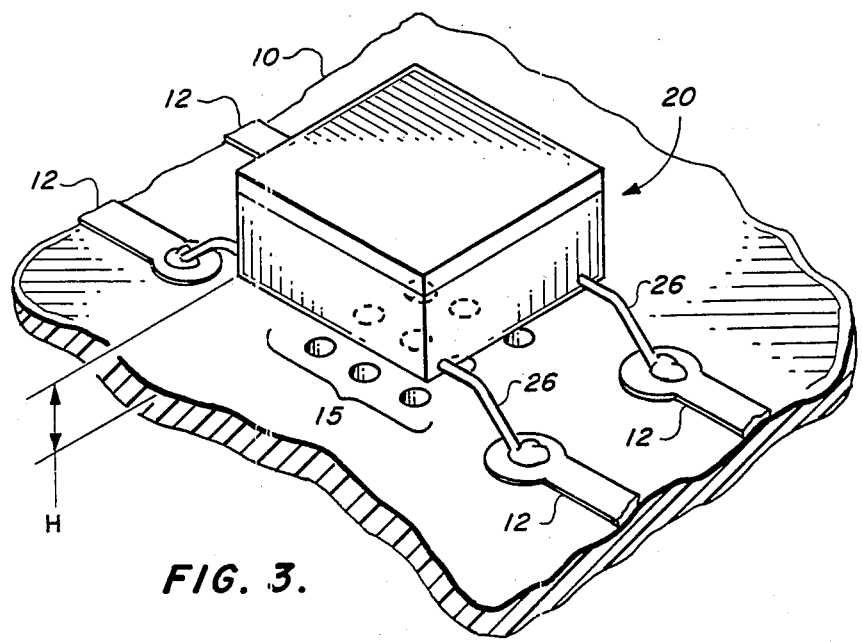
FIG. 3 is a perspective view showing the relationship of the nozzle apertures to the component package being cooled.

Referring next to FIG. 3, the position of the aperture or nozzle array 15 with respect to surface mount component package 20 is shown. The component package 20 is positioned a distance H from the circuit board 10. The array of apertures 15 is generally positioned in the immediate vicinity of the component package 20. The component package leads 26, coupled to the conducting paths 12 on the surface of the circuit board, physically support the component package 20 away from the surface of the circuit board. Although the nozzle array is generally shown to be symmetrical with respect to the component package, 20 as will be discussed below, this configuration can be varied in some situations.

Figure 4A:
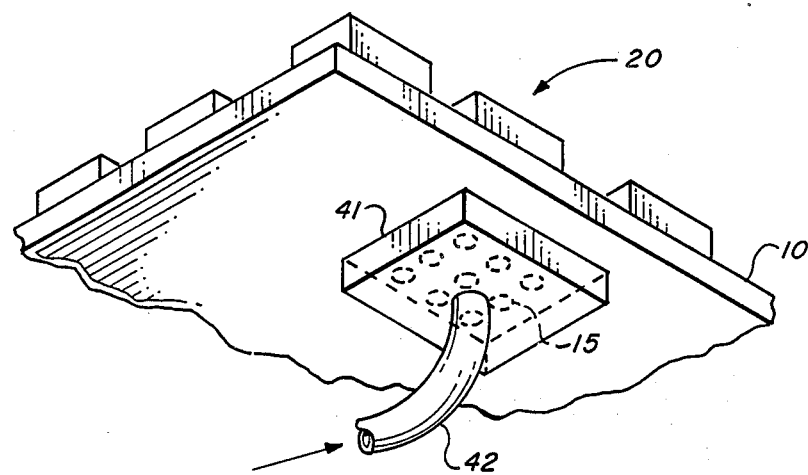
Figure 4B:
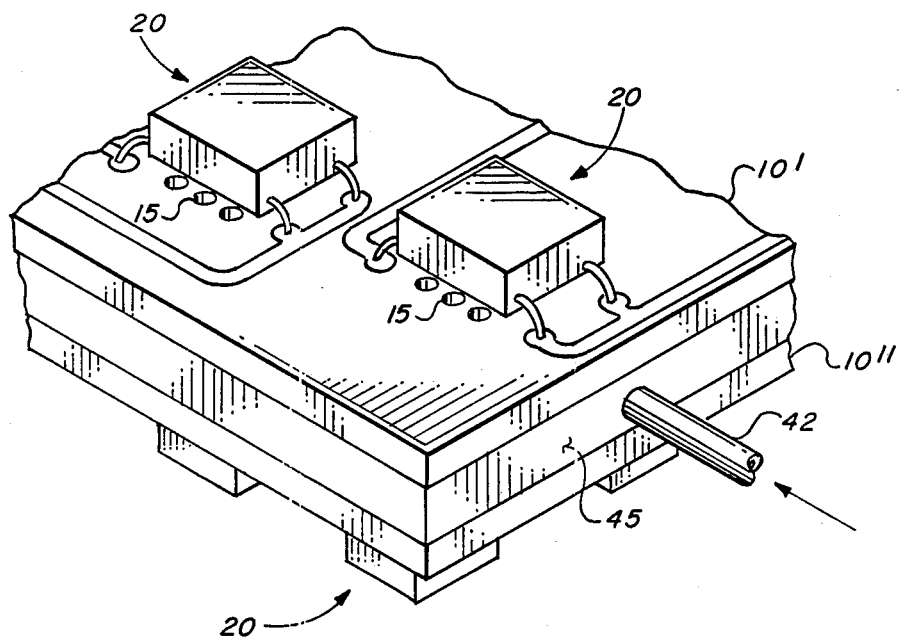
FIG. 4B illustrates a technique for cooling components on two adjacent circuit boards.

Referring next to FIG. 4A, the bottom portion of a circuit board 10, having component packages 20 on the top surface, is shown. A local manifold 41 is coupled to the bottom surface of the circuit board and confines the cooling medium, introduced into the reservoir by inlet tube 42, using some portion of the bottom surface of the circuit board as part of the reservoir. When the apertures in the circuit board are formed in the manifold portion, then the cooling medium can, because of a pressure differential, be forced through the apertures past the component package and carry away heat generated by the component(s). In FIG. 4B, a reservoir of the pressurized cooling medium is formed by using the bottom portion of at least one circuit board, and, in the preferred embodiment the bottom portion of two circuit boards as a part of the manifold. The reservoirs have a wall 45 that serves to control the spacing between the walls (e.g., circuit boards) and to confine a pressurized cooling medium entered into the reservoir by inlet tube 42. By appropriate positioning of the apertures in the circuit board, selected component and selected portions of the component packages can be cooled by the passage of the cooling medium around the component packages.

2. OPERATION OF THE PREFERRED EMBODIMENT

The component package 20 is in thermal contact with a cooling medium and a pressure differential (with the low pressure of the component package side of the circuit board) is applied across the circuit board 10. The pressure differential causes the cooling medium to flow through the aperture array 15 toward the component package. By placing the component package a distance H from the circuit board, the cooling medium entering the component package side of the circuit board can flow past the component package and particularly the hotter bottom surface of the component package. The flow insures that the heated cooling medium will be removed from the bottom surface of the component package before the thermal transfer is compromised. L. M. Jiji and Z. Dagan, in "Experimental Investigation of Single Phase Multi-Jet Impingement Cooling of an Array of Microelectronic Heat Sources" Proc. of the Int. Symp. on Cooling Techniques for Electronic Equipment, Mar. 17–21,1987; Honolulu, Hawaii has demonstrated that after a body to be cooled has been moved a minimum distance from the apertures (nozzles), so that the body does not interfere with the flow, the value of H is relatively unimportant in the cooling. (an optimal value of H can be the result of the inclusion of limitations resulting from transfer of electrical signals from the circuit board to the component package.)

By applying appropriate pressure to the cooling medium on one side of the circuit board, the cooling medium (fluid, gas, or mixture) will have a substantial flow past the component package. A cooling fan or pump apparatus can then be used to remove the heated cooling medium or gas from the vicinity of the component package. In other implementations, gravity can remove the warmed cooling medium from the vicinity of the component package. Indeed, for certain applications, liquid vaporization can enhance the component package cooling, the resulting vapor carrying away the heat through both the heat of vaporization and the bubble induced pumping mechanisms. The removal of heat from the vicinity of the package can thus be accomplished in a multiplicity of techniques, not all of which are herein described. The flow of the cooling medium away from the region of heat dissipation prevents an increase in the temperature of the cooling medium, thereby maintaining efficient heat transfer.

The FIGS. suggest that the nozzle array pattern is uniform to provide generally uniform cooling for a component package. For some component packages, the heat dissipation can be non-uniform and, in fact, can be localized. It will be clear that the nozzle array pattern can be altered to provide increased cooling at a specific location on the component package by clustering the individual nozzles and/or by directing the inclination of the apertures through the circuit board. It will also be clear to those skilled in the art that the apertures fabricated in the circuit board for electrical coupling purposes, generally referred to as "vias", can be used to conduct cooling medium from one side of a circuit board to a second side.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A method of cooling component packages, said method comprising the steps of:
   forming arrays of apertures in a circuit board at predetermined locations;
   coupling a component package in a vicinity of a one of said predetermined locations on a first side of said circuit board;
   placing said circuit board in thermal contact with a cooling medium; and
   providing a lesser pressure for said cooling medium on said first side of said circuit board.

2. The method of cooling component packages of claim 1 further comprising the step of positioning an array of apertures and said component package wherein said cooling medium flowing through said array of apertures is directed toward said component package.

3. The method of cooling component packages of claim 2 further comprising the step of positioning said component package relative to said array of apertures wherein said cooling fluid is released from said array of apertures between said circuit board and said component package, said component package being coupled to said circuit board to permit cooling fluid to flow between a base of said component package and said circuit board.

4. The method of cooling component packages of claim 1 further comprising the steps of:
   coupling said component package to said circuit board first side a preselected distance from said circuit board; and
   causing said cooling medium flowing through said array of apertures to enter a region between said circuit board first side and said component package base.

5. The method of cooling component packages of claim 4 further comprising the step of implementing said cooling medium with a one selected from the group consisting of a liquid cooling medium and a gas medium.

6. The method of cooling component packages of claim 5 further comprising the step of forming a reservoir for said cooling medium with a second side of said circuit board and a second circuit board.

7. The method of cooling component packages of claim 6 further comprising the step of providing a flow of said cooling fluid removing said cooling fluid from a vicinity of said component package.

8. Cooling apparatus for cooling component packages coupled to a circuit board, said apparatus comprising:
   at least one location for mounting a one of said component packages on a first side of said circuit board, wherein said one component package is mounted a distance from said first side of said circuit board to permit a cooling fluid to flow between circuit board first side and a base of said one component package;
   a reservoir adapted to contain said cooling fluid under pressure in a vicinity of said one location, said reservoir being positioned on a second side of said circuit board; and
   an array of apertures formed in said circuit board permitting a flow of said cooling fluid from said reservoir toward a base of said one component package.

9. The cooling apparatus from cooling component packages of claim 8 further including:
   a second circuit board, wherein said reservoir is formed by an area enclosed by said circuit board second side and a second side of said second circuit board.

10. The cooling apparatus for cooling component packages of claim 9 wherein said aperture array positioned to introduce cooling fluid between said circuit board and said one component package base and directed toward a preselected portion of said one component package base.

11. The cooling apparatus for cooling component packages of claim 8 further comprising a manifold for enclosing said cooling fluid on said second circuit board side in a vicinity of said aperture array, said cooling fluid on said circuit board second side having a positive pressure compared to a pressure of said cooling fluid on said circuit board first side.

12. The method of cooling a component package coupled to a circuit board, said method comprising the steps of:
   electrically and mechanically coupling said component package to a second side of said circuit board, said component package being located a preselected distance from said circuit board second side;
   establishing a pressure differential for said cooling fluid of each side of said circuit board, wherein said cooling fluid pressure is higher on a first circuit board side; and
   locating an aperture array in said circuit board in a vicinity of said coupled component package directing cooling fluid passing through said apertures toward said component package.

13. The method of cooling a component package of claim 12 further comprising the step of causing said cooling fluid on said circuit board second side to be removed from a vicinity of said component package.

14. The method of cooling a component package of claim 13 further comprising the step of enclosing said cooling fluid between said circuit board first side and a second circuit board.

15. The method of cooling a component package of claim 13 further comprising the step of enclosing said cooling fluid between said circuit board first side and a manifold positioned over said apertures.

* * * * *